United States Patent
Siddiqui et al.

(10) Patent No.: US 11,532,352 B2
(45) Date of Patent: Dec. 20, 2022

(54) ENHANCED READ SENSING MARGIN FOR SRAM CELL ARRAYS

(71) Applicant: Synopsys, Inc., Mountain View, CA (US)

(72) Inventors: M. Sultan M. Siddiqui, Noida (IN); Sudhir Kumar Sharma, New Delhi (IN); Sudhir Kumar, New Delhi (IN); Ravindra Kumar Shrivastava, Noida (IN)

(73) Assignee: SYNOPSYS, INC., Mountain View, CA (US)

( * ) Notice: Subject to any disclaimer, the term of this patent is extended or adjusted under 35 U.S.C. 154(b) by 27 days.

(21) Appl. No.: 17/025,448

(22) Filed: Sep. 18, 2020

(65) Prior Publication Data

US 2021/0090639 A1    Mar. 25, 2021

(30) Foreign Application Priority Data

Sep. 20, 2019 (IN) .............................. 201911037924

(51) Int. Cl.
*G11C 11/419* (2006.01)
(52) U.S. Cl.
CPC .................................. *G11C 11/419* (2013.01)
(58) Field of Classification Search
CPC ................................................... G11C 11/154
USPC .......................................................... 365/154
See application file for complete search history.

(56) References Cited

U.S. PATENT DOCUMENTS

| | | | | |
|---|---|---|---|---|
| 2010/0142258 | A1* | 6/2010 | Tsai | G11C 7/02 365/189.011 |
| 2010/0231292 | A1* | 9/2010 | Shau | G11C 11/419 29/829 |
| 2014/0078817 | A1* | 3/2014 | Bentum | H01L 27/1104 365/189.11 |
| 2014/0269091 | A1* | 9/2014 | Zheng | G11C 7/12 365/185.21 |
| 2016/0225437 | A1* | 8/2016 | Kumar | G11C 8/16 |
| 2020/0066333 | A1* | 2/2020 | Fujiwara | G11C 11/418 |

OTHER PUBLICATIONS

Wang, A. and Chandrakasan, A., "A 180-mV Subthreshold FFT Process Using a Minimum Energy Design Methodology," IEEE Journal of Solid-State Circuits, vol. 40, No. 1, Jan. 2005, pp. 310-319.

(Continued)

*Primary Examiner* — Sung Il Cho

(57) ABSTRACT

This disclosure describes a memory cell array with enhanced read sensing margin. The memory cell array includes a write port and a read port being connected through first and second data storage lines. The memory cell array further includes multiple word lines and bit lines arranged in rows and columns such that the read port is coupled to a read word line, a read bit line, and a virtual ground. The read port includes a first transistor coupled to at least the read bit line and the virtual ground, a second transistor coupled to at least the first data storage line and the first transistor, a third transistor coupled to at least the second data storage line and the read word line, and a fourth transistor coupled at least the first data storage line and the read word line.

20 Claims, 11 Drawing Sheets

(56) References Cited

OTHER PUBLICATIONS

Zeinolabedin, S. et al., "A 128-Channel Spike Sorting Processor Featuring 0.175 µW and 0.0033 mm² per Channel in 65-nm CMOS," 2016 Symposium on VLSI Circuits Digest of Technical Papers, Downloaded on Jul. 18, 2020 at 10:29:53 UTC from IEEE Xplore; 2 pages.
Chang, L. et al., "An 8T-SRAM for Variability Tolerance and Low-Voltage Operation in High-Performance Caches," IEEE Journal of Solid-State Circuits, vol. 43, No. 4, Apr. 2008, pp. 956-963.
Calhoun, B. and Chandrakasan, A., "a 256-kb 65-nm Sub-threshold SRAM Design for Ultra-Low-Voltage Operation," IEEE Journal of Solid-State Circuits, vol. 42, No. 3, Mar. 2007, pp. 680-688.
Yang, B. and Kim, L., "A Low-Power SRAM Using Hierarchical Bit Line and local Sense Amplifiers," IEEE Journal of Solid-State Circuits, vol. 40, No. 6, Jun. 2005, pp. 1366-1376.
Verma, N. and Chandrakasan, A. "A 65nm 8T Sub-$V_t$ SRAM Employing Sense-Amplifier Redundancy," ISSCC 2007, Session 18, SRAM 18.4, 2007 IEEE International Solid-State Circuits Conference, Downloaded on Jul. 18, 2020 at 10:35:11 UTC from IEEE Xplore, 3 pages.
Keane, J. et al., "5.6Mb/mm² 1R1W 8T SRAM Arrays Operating down to 560mV Utilizing Small-Signal Sensing with Charge-Shared Bitline and Asymmetric Sense Amplifier in 14nm FinFET CMOS Technology," ISSCC 2016, Session 17, SRAM 17.2, 2016 IEEE International Solid-State Circuits Conference, Downloaded on Jul. 18, 2020 at 10:36:22 UTC from IEEE Xplore; 3 pages.
Chang, J. et al., "A 20nm 112Mb SRAM in High-κ Metal-Gate with Assist Circuitry for Low-Leakage and Low-$V_{MIN}$ Applications," ISSCC 2013, Session 18, Advanced Embedded SRAM 18.1, 2013 IEEE International Solid-State Circuits Conference, Downloaded on Jul. 18, 2020 at 10:38:04 UTC from IEEE Xplore; 3 pages.
Song, T. et al., "A 14 nm FinFET 128 Mb SRAM With $V_{MIN}$ Enhancement Techniques for Low-Power Applications," IEEE Journal of Solid-State Circuits, vol. 50, No. 1, Jan. 2015, pp. 158-169.
Chen, C. et al., "A 210mV 7.3MHz 8T SRAM with Dual Data-Aware Write-Assists and Negative Read Wordline for High Cell-Stability, Speed and Area-Efficiency," 2013 Symposium on VLSI Circuits Digest of Technical Papers, Downloaded on Jul. 18, 2020 at 10:40:23 UTC from IEEE Xplore; 2 pages.
Jeon, D. et al., "A 23mW Face Recognition Accelerator in 40nm CMOS with Mostly-Read 5T Memory," 2015 Symposium on VLSI Circuits Digest of Technical Papers, Downloaded on Jul. 18, 2020 at 10:42:48 UTC from IEEE Xplore; 2 pages.
Wu, J. et al., "A Large $\sigma V_{TH}$/VDD Tolerant Zigzag 8T SRAM with Area-Efficient Decoupled Differential Sensing and Fast Write-Back Scheme," 2010 Symposium on VLSI Circuits, Technical Digest of Technical Papers, Downloaded on Jul. 18, 2020 at 10:49:10 UTC from IEEE Xplore; 2 pages.
Kim, T. et al., "A Voltage Scalable 0.26 V, 64 kb 8T SRAM With $V_{min}$ Lowering Techniques and Deep Sleep Mode," IEEE Journal of Solid-State Circuits, vol. 44, No. 6, Jun. 2009, pp. 1785-1795.
Yeoh, Y. et al., "A 0.4V 7T SRAM with Write Through Virtual Ground and Ultra-fine Grain Power Gating Switches," VIRTUS, School of EEE, Nanyang Technological University, Singapore, IEEE 2013, pp. 3030-3033.
Kim, T. et al., "A 0.2 V, 480 kb Subthreshold SRAM With 1 k Cells Per Bitline for Ultra-Low-Voltage Computing," IEEE Journal of Solid-State Circuits, vol. 43, No. 2, Feb. 2008, pp. 518-529.

* cited by examiner

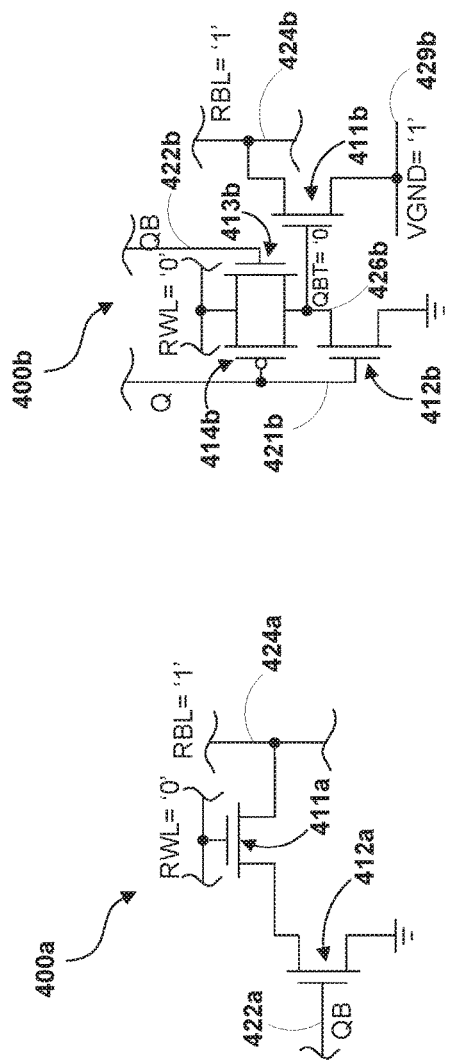
FIG. 4A
FIG. 4B
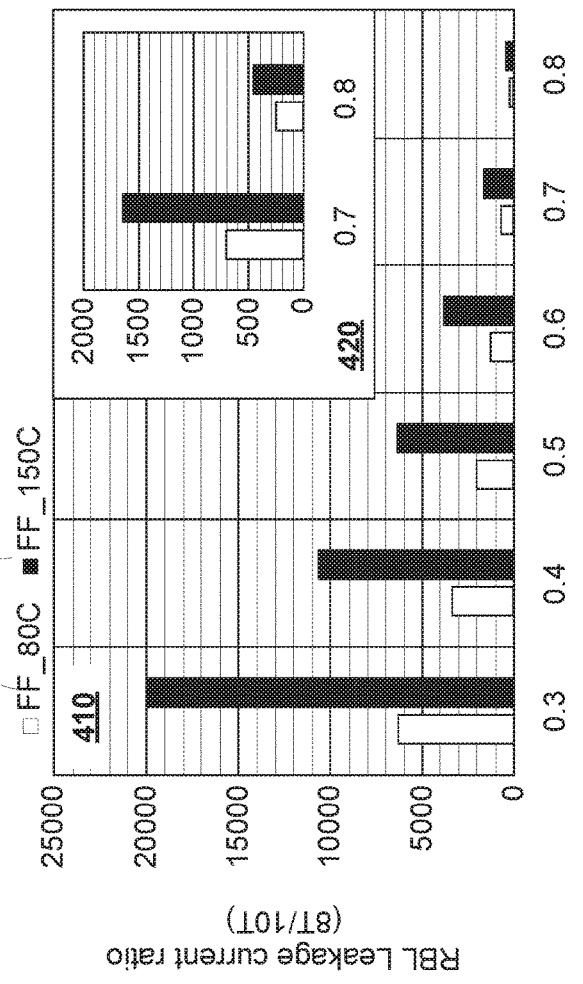
FIG. 4C

ENHANCED READ SENSING MARGIN FOR SRAM CELL ARRAYS

CROSS-REFERENCE TO RELATED APPLICATIONS

The present application claims priority under 35 U.S.C. § 119(a)-(d) to Indian (IN) Patent Application No. 201911037924 titled "Ultra-Low Voltage 10T SRAM cell with Enhanced Read Sensing Margin in 5-nm FinFET Technology," filed Sep. 20, 2019, which is hereby incorporated by reference in its entirety for all purposes.

TECHNICAL FIELD

The present disclosure relates to static random-access memory (SRAM) cell arrays.

BACKGROUND

System-on-chip (SoC) designs are widely used in consumer electronics due to their lower power consumption and smaller form factors. Such advantages promote SOC design applications in wearable devices, Internet of Things (IoT) products, and medical devices. SOC systems are designed to be energy efficient to maximize system lifetime. Operation at a minimum energy point may be achieved by dynamic voltage scaling to a lower supply voltage. SRAM occupies significant circuit area in SoC systems and expends large amounts of power and energy. Six-transistor (6T) SRAMs do not operate optimally in ultra-low voltages due to degradation in design parameters such as Static Noise Margin (SNM), poor read and write margins, and exponentially increased sensitivity to process-voltage-temperature (PVT) fluctuation.

While an eight-transistor (8T) SRAM cell with a separated read port for decoupled read and write operations have been designed for improved operation in ultra-low voltage applications with increased cell stability, the 8T SRAM cell can suffer data-dependent Read Bit Line (RBL) leakage through its read port. RBL leakage can deteriorate its read sensing margin in terms of voltage and time window caused by small ON-current to OFF-current ($I_{ON}$-to-$I_{OFF}$) ratios at ultra-low voltages. Decoupled SRAM cells can boost RBL sensing margins.

SUMMARY

This disclosure describes a memory cell array with enhanced read sensing margin. The memory cell array includes a write port and a read port being connected through a first data storage line and a second data storage line. The memory cell array further includes multiple word lines and bit lines arranged in rows and columns such that the read port is coupled to a read word line and a read bit line of the multiple word lines and bit lines. The read port is further coupled to a virtual ground. The read port includes a first transistor coupled to at least the read bit line and the virtual ground, a second transistor coupled to at least the first data storage line and the first transistor, a third transistor coupled to at least the second data storage line, the read word line, the first transistor, and the second transistor, and a fourth transistor coupled to at least the first data storage line, the read word line, the first transistor, the second transistor, and the third transistor.

This disclosure also describes a memory device to enhance read sensing margin for SRAM cell arrays. The memory device includes a memory cell array including first and second bit cells and multiple word lines and bit lines arranged in rows and columns and being connected to the first and second bit cells. Each of the first and second bit cells includes a write port and a read port being connected through a first data storage line and a second data storage line. The read port of the first bit cell is coupled to a first virtual ground, a first read word line of the multiple word lines, and a read bit line of the plurality of bit lines. The read port of the second bit cell is coupled to a second virtual ground, a second read word line of the multiple word lines, and the read bit line. Each of the first and second virtual grounds are operatively connected to the first and second read word lines respectively through an inverter.

This disclosure also describes a method for enhancing read sensing margin for SRAM cell arrays. The method includes operating a memory cell array in response to a read operation. The memory cell array includes a write port storing a data value and a read port coupled to a read word line and a read bit line. The method further includes precharging the read bit line to a supply voltage, setting a virtual ground coupled to the read port of the bit cell to a complement of a logic value carried on the read word line of the bit cell, and operating an inverter coupled to the read bit line to read the data value.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIGS. 4A-4C illustrate circuit diagrams to measure RBL leakage currents for 8T SRAM and 10T SRAM cells and a graph illustrating a leakage current ratio between 8T SRAM and 10T SRAM cells as a function of supply voltage, according to some embodiments of the present disclosure.

DETAILED DESCRIPTION

Aspects of the present disclosure relate to enhanced sensing margin for SRAM cell arrays. SoC systems can improve energy efficiency and maximize system lifetime with dynamic voltage scaling to a lower supply voltage. 6T SRAMs do not operate optimally in ultra-low voltage due to degradation in various design parameters. An 8T SRAM cell designed with a separated read port for decoupling read operation and write operation can improve cell stability for ultra-low voltage application. However, the 8T SRAM cell can suffer data-dependent RBL leakage through its read port, which can deteriorate read sensing margin by reducing the read sensing voltage and time window.

Various embodiments in accordance with the present disclosure provide systems and methods to enhance read sensing margin for SRAM cell array designed with a 10T SRAM cell having data-independent RBL leakage. The 10T SRAM cell can include a six-transistor (6T) write port to store a data value and a four-transistor (4T) read port to read the date value. The 6T write port and 4T read port can be coupled through a data storage line and a complementary data storage line. The 4T read port can be coupled to a read word line, a read bit line, and a virtual ground. The virtual ground can be operatively connected to the read word line through an inverter. The read bit line can be further coupled to an inverter, which is accessible for a memory read operation. The read bit line can be pre-charged to a supply voltage (e.g., VDD) for a memory read operation.

When a logic value on the read word line is '0,' the bit cell is unselected and the virtual ground has a logic value of 1. A transistor in the 4T read port connected to the read bit line has a negative gate to source voltage regardless of the data value stored in the write port, which can reduce RBL leakage current by about 6000 times compared to the 8T SRAM cell. When a logic value on the read word line is '1', the bit cell is selected and the virtual ground has a logic value of 0. The transistor in the 4T read port connected to the read bit line can be turned on and the data value in the write port can be accessed on the read bit line through the inverter. The 4T read port can improve RBL sensing voltage about 7.3 times and read delay about 10 times compared to 8T SRAM cell.

Figure 1:
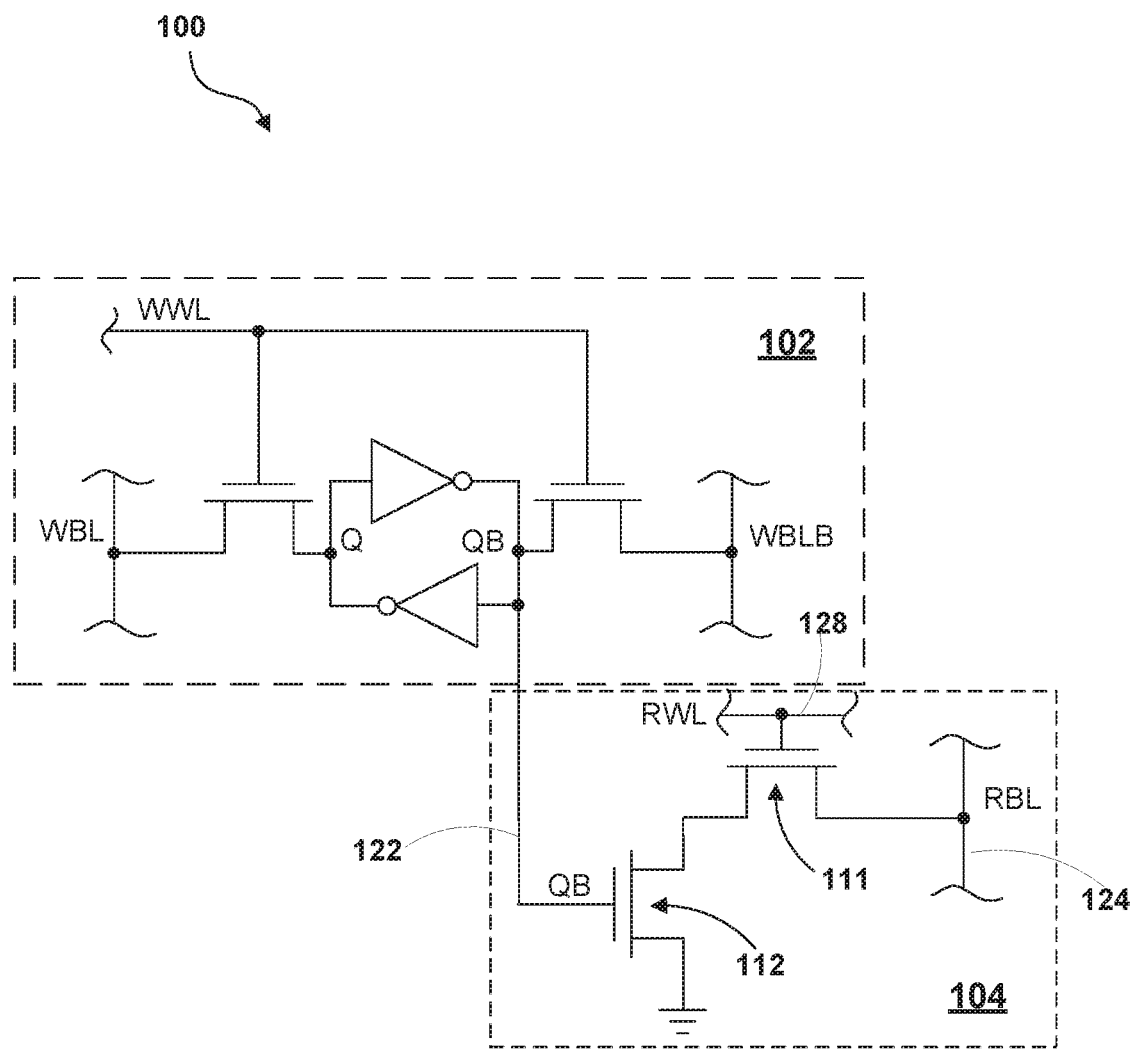
FIG. 1 depicts a circuit diagram illustrating an 8T SRAM cell, according to some embodiments of the present disclosure.

FIG. 1 depicts a circuit diagram illustrating an 8T SRAM cell, according to some embodiments of the present disclosure. As shown in FIG. 1, 8T SRAM cell 100 includes a 6T write port 102 and a two-transistor (2T) read port 104. In some embodiments, 8T SRAM cell 100 can be a bit cell of an 8T SRAM cell array. 6T write port 102 stores data value Q and QB (i.e., "Q bar"), where QB is a complementary data value of Q. 2T read port 104 can be decoupled from 6T write port 102 during read operations (e.g., RBL 124 of 2T read port 104 is separated from the Write Bit Line (WBL) of 6T write port 102), which can reduce the likelihood of disturbing current noise from read operations interfering with data storage nodes of 6T write port 102, thereby improving the static noise margin. 2T read port 104 includes transistors 111 and 112. Transistor 111 is coupled to a Read Word Line (RWL), transistor 112, and RBL 124 such that when RWL='0' (i.e., the logic value on the RWL 128 is 0), 2T read port 104 is operating in a standby mode and when RWL='1,' 2T read port 104 is operating in a read mode. In the standby mode, transistor 111 is at an OFF state and data QB may not be read onto RBL 124. In the read mode, transistor 111 is at an ON state and data QB can be read onto RBL 124. Transistor 112 is coupled to transistor 111, a data storage node (e.g., the data storage node associated with data value QB) through data storage line 122, and a common ground such that when QB='0,' transistor 112 is OFF and when QB='1,' transistor 112 is ON. In some embodiments, transistors 111 and 112 can be n-type metal-oxide semiconductor (NMOS) transistors.

During a read operation, RBL is pre-charged to a supply voltage (e.g., logic value '1'). When RWL='1' (i.e., 2T read port 104 is selected), transistor 111 is ON and the data value of QB can be read from data storage line 122 onto RBL 124 through transistor 111. An operation to read Q='0' is referred to herein as "RBL Read '0'" or "RBL0." For RBL Read '0,' QB, the complementary data value of Q, is '1,' causing transistor 112 to be ON. As a result, the charge on RBL 124 is discharged to the common ground through transistors 111 and 112. RBL 124 may have a logic value of '0' based on the discharge, thereby passing the data value '0' of Q to RBL 124. An operation to read Q='1' is referred to herein as "RBL Read'1'" or "RBL1." For RBL Read '1,' QB is '0,' causing transistor 112 to be OFF. With transistor 111 ON and transistor 112 OFF, the charge on RBL 124, in some embodiments, may not be discharged to the common ground and can have a logic value of '1' based on the charge maintained on RBL 124.

Figure 2:
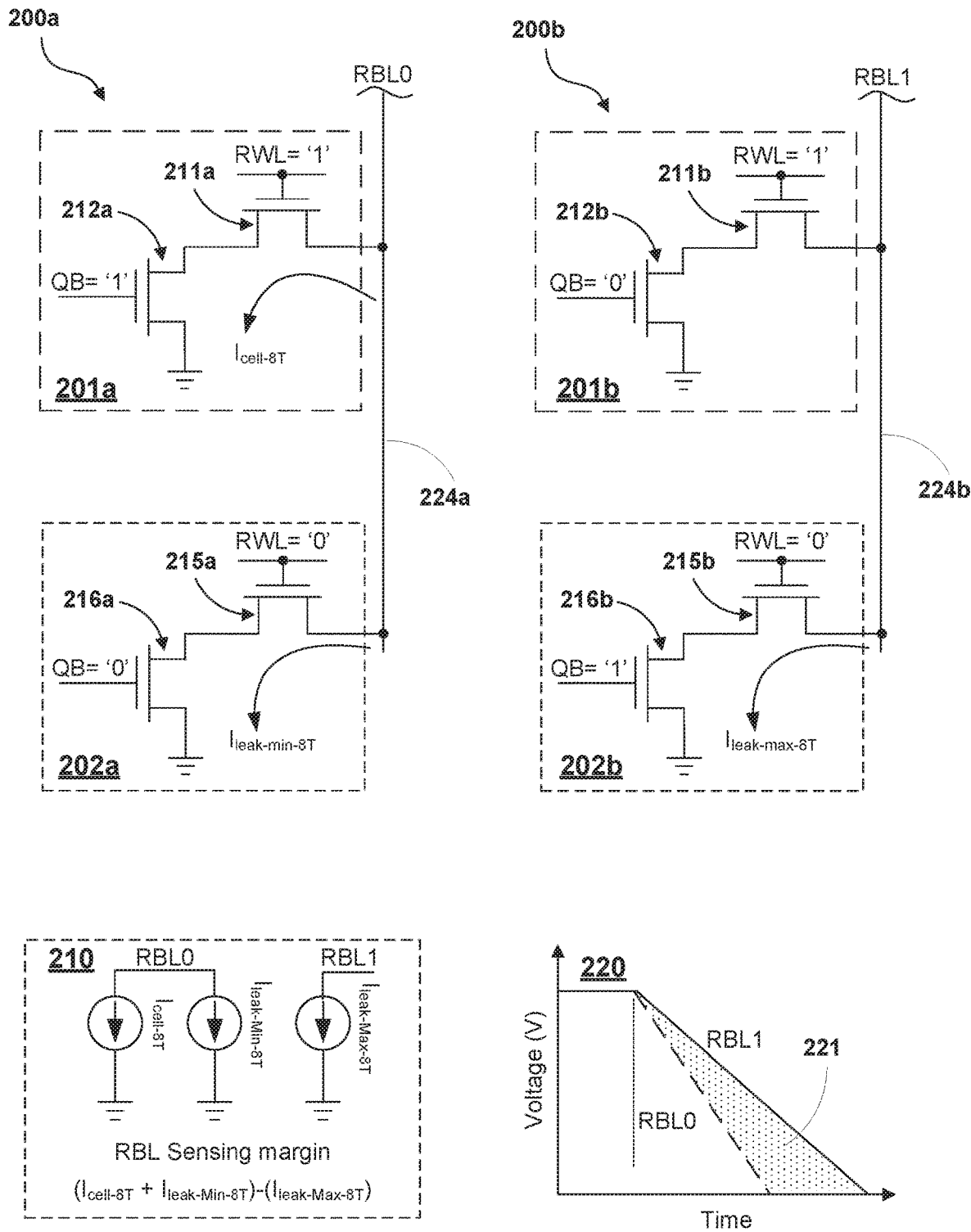
FIG. 2 illustrates the principle of RBL sensing margin for 8T SRAM cell arrays, according to some embodiments of the present disclosure.

FIG. 2 illustrates the principle of RBL sensing for 8T SRAM cell arrays during two read operations, according to some embodiments of the present disclosure. The write ports of the cells in 8T SRAM cell arrays 200a and 200b are not illustrated in FIG. 2 merely for clarity and ease of description. In some embodiments, 8T SRAM cell arrays 200a and 200b can illustrate a same 8T SRAM cell array under different read operations. In some embodiments, 8T SRAM cell array 200a can be in the read operation of RBL Read '0' and have a column of 8T SRAM cells including cell 201a and cell 202a coupled to a read bit line RBL0 224a. In some embodiments, 8T SRAM cell array 200a can illustrate reading a data value of '0' (e.g., Q='0' and QB='1') onto RBL0 224a, denoted as 'RBL0' corresponding to the data value. Cell 201a can illustrate a selected cell in 8T SRAM cell array 200a with RWL='1' (also referred to as "selected cell 201a") and cell 202a can illustrate other unselected cells coupled to RBL0 224a in 8T SRAM cell array 200a with RWL='0' (also referred to as "unselected cell 202a"). Under certain conditions, selected cell 201a can store a data value of '0' (e.g., Q='0' and QB='1') and the data value in selected cell 201a can be read onto RBL0 224a. Unselected cells illustrated by unselected cell 202a can store data values of '1' (e.g., Q='1' and QB='0') and the data values in the unselected cells may not be read onto RBL0 224a.

In some embodiments, 8T SRAM cell array 200b can be in the read operation of RBL Read '1' and have a column of 8T SRAM cells including cell 201b and cell 202b coupled to a read bit line RBL1 224b. 8T SRAM cell array 200b can illustrate reading a data value of '1' (e.g., Q='1' and QB='0') onto RBL1 224b, denoted as 'RBL1' corresponding to the data value. Similar to 8T SRAM cell array 200a, cell 201b can illustrate a selected cell in 8T SRAM cell array 200b with RWL='1' (also referred to as "selected cell 201b") and cell 202b can illustrate other unselected cells coupled to RBL1 224b in 8T SRAM cell array 200b with RWL='0' (also referred to as "unselected cell 202b"). Under certain conditions, selected cell 201b can store a data value of '1' (e.g., Q='1' and QB='0') and the data value in selected cell 201b can be read onto RBL1 224b. Unselected cells illustrated by unselected cell 202b can store data values of '0' (e.g., Q='0' and QB='1') the data values in the unselected cells may not be read onto RBL1 224b.

According to some embodiments, 8T SRAM cell arrays 200a and 200b can have data-dependent leakage current (e.g., current leakage depends on the stored data values of Q and QB). During an RBL Read '0' operation for 8T SRAM cell array 200a, selected cell 201a can store a data value of '0' (e.g., Q='0' and QB='1'), and unselected cell 202a can store a data value of '1' (e.g., Q='1' and QB='0'). RBL0 224a can be pre-charged to a supply voltage (e.g., a logic value of '1') and can read the data value in selected cell 201a. For selected cell 201a, transistors 211a and 212a are 'ON' and RBL0 is discharged to '0' with a discharging current $L_{cell-8T}$. Although unselected cell 202a stores a data value QB='0' and the RWL is '0' to enable standby operation for unselected cell 202a, transistors 215a and 216a can discharge RBL0 with a minimal leakage current, $L_{leak-min-8T}$. The minimal leakage notation is used to reflect the minimum leakage from a read port occurring when both RWL and QB are '0' and the corresponding transistors (e.g., transistors 215a and 216a) are turned 'OFF.' Accordingly, for 8T SRAM cell array 200a during the RBL Read '0' operation, a total current discharging RBL0 can be $L_{cell-8T}$+ $I_{leak-min-8T}$, as shown in a schematic graph 210. 8T SRAM cell array 200a during the RBL Read '0' operation may reflect a conditionally, worst-case read '0' operation (i.e., a data-dependent current leakage when QB='0' for unselected cells).

During an RBL Read '1' operation for 8T SRAM cell array 200b, selected cell 201b can store a data value of '1' (e.g., Q='1' and QB='0'), and unselected cell 202a can store a data value of '0' (e.g., Q='0' and QB='1'). RBL1 224b can be pre-charged to a supply voltage (e.g., a logic value of '1') and can read the data value in selected cell 201b. For selected cell 201b, transistor 211b is 'ON,' transistor 212b is 'OFF,' and RBL1 can be maintained at the supply voltage such that RBL1 224b can maintain a logic value of '1.' Although transistor 215b is 'OFF,' transistor 216b is 'ON' and a leakage current can pass through transistors 215b and 216b. The leakage current can be a maximum leakage current through unselected cells and denoted as $I_{leak-max-8T}$. Accordingly, for 8T SRAM cell array 200b during the RBL Read '1' operation, a total current discharging RBL1 can be $I_{leak-max-8T}$, as shown in schematic graph 210. In some embodiments, $I_{leak-max-8T}$ can depend on the number of unselected cells connected to the RBL1 224b. 8T SRAM cell array 200b during the RBL Read '1' operation may reflect a conditionally, worst-case read '1' operation (i.e., a data-dependent current leakage when QB='1' for unselected cells). In some embodiments, the RBL sensing margin of an 8T SRAM cell array can be determined based upon the current differential of RBL0-RBL1 or $(I_{cell-8T}+I_{leak-min-8T})-(I_{leak-max-8T})$, as shown in schematic graph 210.

In some embodiments, the data-dependent current leakage can limit the maximum number of bit cells per RBL and can lead to a small RBL sensing margin. Graph 220 depicts the RBL sensing margin of an 8T SRAM cell array over time. As shown in graph 220, the voltage of RBL0 over time is depicted as a dash line while the voltage over time of RBL1 is depicted as a solid line. The dotted, vertical line represents the time when the RWL is switched from '0' to '1' (i.e., a read operation starts). The voltage differential area 221 between RBL0 and RBL1 can represent the RBL sensing margin for the 8T SRAM cell array.

Figure 3:
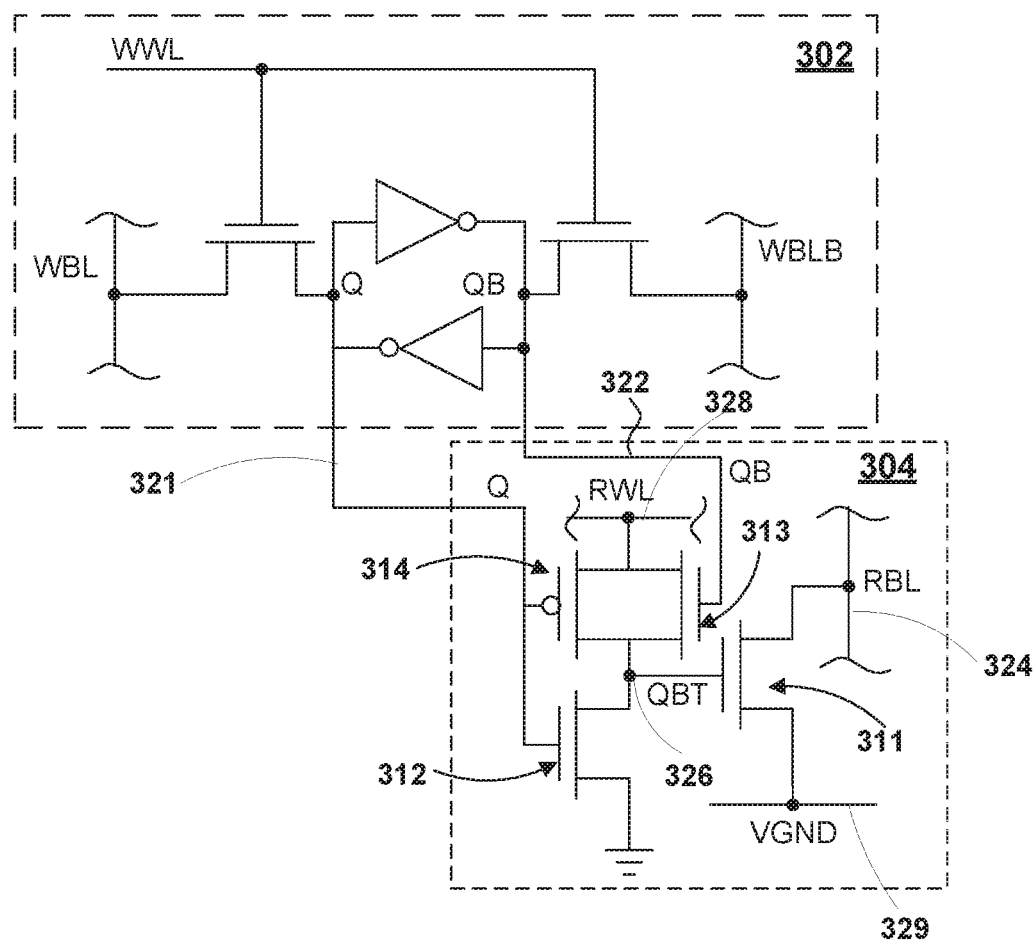
FIG. 3 depicts a circuit diagram illustrating a ten-transistor (10T) SRAM cell, according to some embodiments of the present disclosure.

FIG. 3 depicts a circuit diagram illustrating a 10T SRAM cell, according to some embodiments of the present disclosure. 10T SRAM cell 300 includes a 6T write port 302 and a 4T read port 304. In some embodiments, 10T SRAM cell 300 can be a bit cell of a 10T SRAM cell array. 6T write port 302 stores data value Q and QB (i.e., "Q bar"), where QB is a complementary data value of Q. 4T read port 304 can be decoupled from 6T write port 302 during read operations (e.g., RBL 324 of 4T read port 304 is separated from the WBL of 6T write port 302), which can reduce the likelihood of the disturbing current noise from read operations interfering with data storage nodes of 6T write port 302, thereby improving the static noise margin. 4T read port 304 includes transistors 311, 312, 313, and 314. As illustrated in FIG. 3, 10T SRAM cell 300 includes additional transistors 313 and 314 and has different connections between the transistors in 4T read port 304, compared to 8T SRAM cell 100 in FIG. 1. 4T read port 304 can be coupled to 6T write port 302 through a data storage line 321 with data value Q and a complementary data storage line 322 with data value QB. 4T read port 304 includes a RWL 328, a RBL 324, and a virtual ground (VGND) 329. In some embodiments, VGND 329 can be operatively connected to RWL 328 through an inverter (not shown in FIG. 3), thereby having a complementary data value of RWL 328 (e.g., VGND='0' when RWL='1' and vice versa).

Transistors 311-314 in 4T read port 304 can be configured as shown in FIG. 3 to have RBL 324 independent of data values stored in 6T write port 302. Transistor 311 is coupled to RBL 124 and transistors 312-314. A gate terminal of transistor 311 is connected to a shared source/drain terminal 326 of transistors 312-314 and is controlled by transistors 312-314. Transistor 311 is connected to RBL 324 through a source/drain terminal and connected to VGND 329 through another source/drain terminal. Data storage line 321 with data value Q is connected to a gate terminal of transistor 312 and a gate terminal of transistor 314. Complementary data storage line 322 with data value QB is connected to a gate terminal of transistor 313. RWL 328 is connected to a shared source/drain terminal of transistors 313 and 314. Transistors 313 and 314 can set QBT on terminal 326 as '0' when RWL is '0,' independent of data values Q and QB in 6T write port 302. In addition, transistors 313 and 314 can pass data value QB to QBT on terminal 326 when RWL is '1.' In some embodiments, transistors 313 and 314 can be replaced by other suitable circuits to achieve the same function. In some embodiments, RBL 324 can be further coupled to an inverter and the output of the inverter can be accessible for a memory read operation. In some embodiments, transistors 311-313 can be NMOS transistors and transistor 314 can be a p-type metal-oxide semiconductor (PMOS) transistor. During a read operation, RBL 324 can be pre-charged to a supply voltage (e.g., a logic value of '1') and data value Q in 6T write port 302 can be read onto RBL 324.

When the logic value on the RWL 328 is 0 (i.e., RWL='0'), 10T SRAM cell 300 is unselected for the read operation, QBT on terminal 326 can have a data value of '0' independent of data values Q and QB in 6T write port 302. VGND 329 can have a data value of '1,' complementary to RWL 328. As a result, transistor 311 is at an 'OFF' state and data values Q and QB may not be read onto RBL 324. When the logic value on the RWL 328 is 1 (i.e., RWL='1'), 10T SRAM cell 300 is selected for the read operation, data value Q in 6T write port 302 can be read onto RBL 324, and RBL 324 can be conditionally discharged if Q='0'. When Q='0' and QB='1,' transistors 313 and 314 can be turned on and transistor 312 can be turned off, thereby data value QBT='1' at terminal 326. As a result, transistor 311 can be turned on and the charge on RBL 324 can be discharged and can have a logic value of '1' based on the charge maintained. When Q='1' and QB='0,' transistors 313 and 314 can be turned off and transistor 312 can be turned on, thereby data value QBT='0' at terminal 326. As a result, transistor 311 can be turned off and the charge on RBL 324 may not be discharged and have a data value of '0' based on the discharge.

In some embodiments, the configuration of transistors 311-314, as shown in FIG. 3, allows for data-independent leakage current in 4T read port 304. VGND 329 and pre-charging of RBL 324 can keep the gate to source voltage of transistor 311 at a negative supply voltage when 10T SRAM cell 300 is unselected, thereby reducing leakage current.

FIGS. 4A-4C illustrate circuit diagrams to measure RBL leakage currents for an 8T SRAM cell and a 10T SRAM cell, and a graph illustrating a leakage current ratio between the 8T SRAM and 10T SRAM cells as a function of supply voltage, according to some embodiments of the present disclosure. As shown in FIG. 4A, for an unselected 8T SRAM cell 400a, transistor 411a can be turned off with RWL='0.' When the stored data value is '0' (i.e., QB='1'), transistor 412a can be turned on. As a result, 8T SRAM cell 400a can have a leakage current through transistors 411a and 412a to discharge the charge on RBL 424a. For an unselected 10T SRAM cell 400b shown in FIG. 4B, when the stored data value is '1' (i.e., Q='1' and QB='0'), transistor 412b can be turned on and transistor 413b and 414b can be turned off. Terminal 426b can have a data value QBT='0.' VGND 429b can have a data value of '1,' complementary to RWL of 10T SRAM cell 400b. The gate to source voltage of transistor 411b can be biased at a negative supply voltage. As a result, 10T SRAM cell 400b can significantly reduce the leakage current through transistor 411b discharging the charge on RBL 424b.

FIG. 4C illustrates a graph of a leakage current ratio between the 8T SRAM and 10T SRAM cells as a function of a supply voltage, according to some embodiments. Inset 420 illustrates an enlarged view of the data in graph 410 for supply voltages of 0.7 V and 0.8 V, according to some embodiment. The data of FIG. 4C may be obtained using a simulation scenario having a read '1' operation, a process corner of Fast NMOS and Fast PMOS (FF), temperatures of 80° C. and 150° C., QB='1' for the read port of an unselected 8T SRAM cell, and QBT='0' for the read port of an unselected 10T SRAM cell. In some embodiments, the simulation scenario can include minimum sizes for read port transistors, for example, NFIN=2 with low voltage threshold for fin field-effect transistor (FinFET) technology. Simulations can be run using a simulation application to obtain the illustrated RBL leakage current ratios of 8T to 10T SRAM cells operating at different supply voltages 0.3 V through 0.8 V with a step of 0.1V. The leakage current ratios of 8T SRAM cell 400a to 10T SRAM cell 400b (8T/10T) at 80° C. are shown in data set 404 and the leakage current ratios of 8T SRAM cell 400a to 10T SRAM cell 400b (8T/10T) at 150° C. are shown in data set 408. In some embodiments, the leakage currents at 80° C. can represent leakage currents in mobile devices under certain conditions. In some embodiments, the leakage currents at 150° C. can represent leakage currents in automobile devices under certain conditions. The leakage current ratios (8T/10T) of data set 404 are higher than the leakage current ratios (8T/10T) of data set 408, as SRAM cells can have higher leakage currents at a higher temperature. For each incremental supply voltage, the RBL leakage current ratio (8T/10T) is greater than about 100 under different conditions, which illustrates that the RBL leakage current for the 10T SRAM cell improves by at least 100 times compared to the RBL leakage current for the 8T SRAM cell under different conditions. For example, as shown in FIG. 4C, the RBL leakage current for the 10T SRAM cell improves by about 6000 times compared to the RBL leakage current for the 8T SRAM cell at worst FF corner under a temperature of 150° C. and with a 0.5 V supply voltage.

Figure 5:
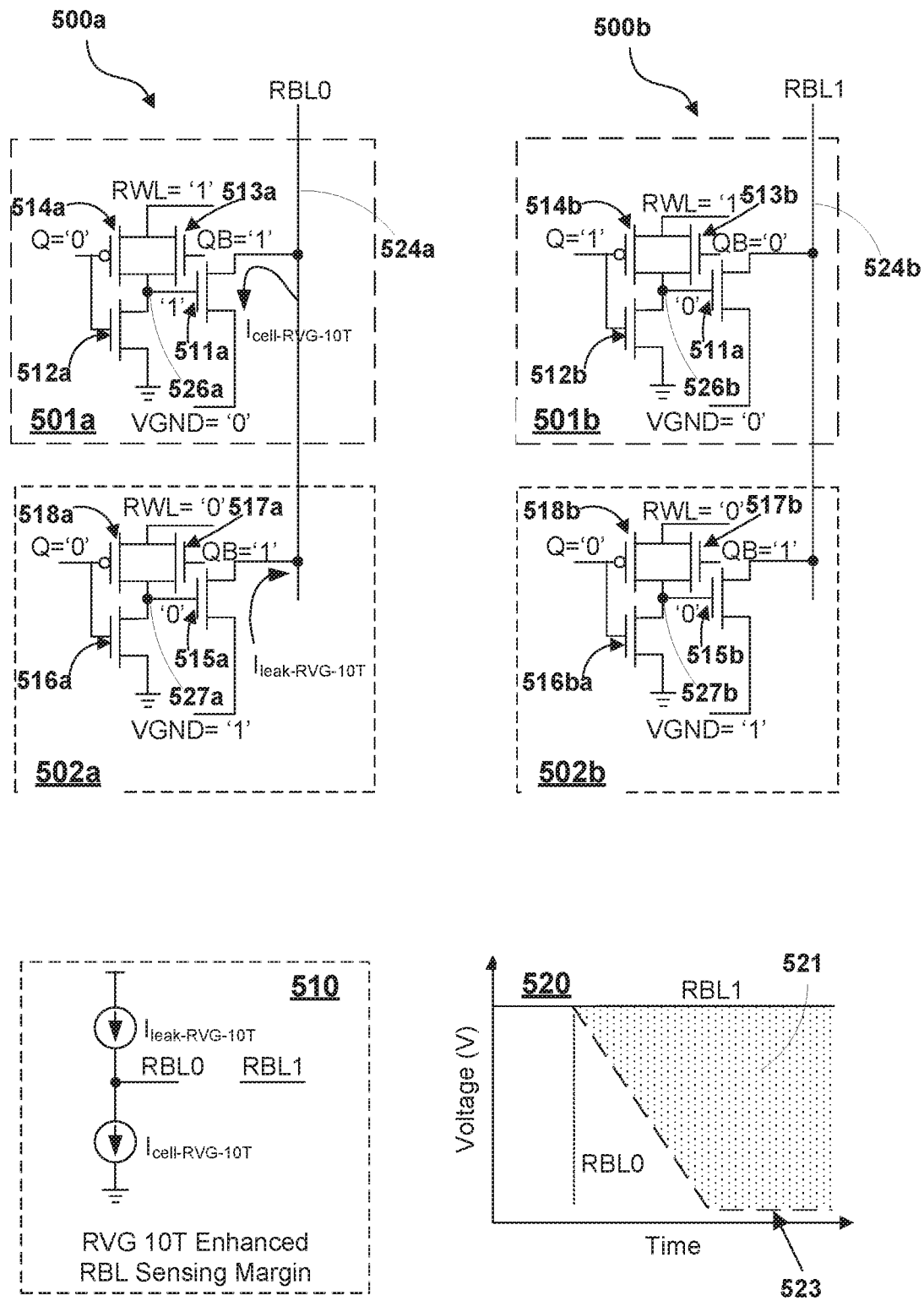
FIG. 5 illustrates the principle of RBL sensing margin for 10T SRAM cell arrays, according to some embodiments of the present disclosure.

FIG. 5 illustrates the principle of RBL sensing margin for 10T SRAM cell arrays, according to some embodiments of the present disclosure. The write ports of the cells in 10T SRAM cell arrays 500a and 500b are not illustrated in FIG. 5 merely for clarity and ease of description. In some embodiments, 10T SRAM cell arrays 500a and 500b can illustrate a same 10T SRAM cell array under different read operations. In some embodiments, 10T SRAM cell array 500a can be in the read operation of RBL Read '0' and have a column of 10T SRAM cells including cell 501a and cell 502a coupled to a read bit line RBL0 524a. In some embodiments, 10T SRAM cell array 500a can illustrate reading a data value of '0' (e.g., Q='0' and QB='1') onto RBL0 524a, denoted as 'RBL0' corresponding to the data value. Cell 501a can illustrate a selected cell in 10T SRAM cell array 500a with RWL='1' (also referred to as "selected cell 501a") and cell 502a can illustrate other unselected cells coupled to RBL0 524a in 10T SRAM cell array 500a with RWL='0' (also referred to as "unselected cell 502a"). Under certain conditions, selected cell 501a can store a data value of '0' (e.g., Q='0' and QB='1') and the data value in selected cell 501a can be read onto RBL0 524a. Unselected cells illustrated by unselected cell 502a can store data values of '1' (e.g., Q='1' and QB='0') and the data values in the unselected cells may not be read onto RBL0 524a.

In some embodiments, 10T SRAM cell array 500b can be in the read operation of RBL Read '1' and have a column of 10T SRAM cells including cell 501b and cell 502b coupled to a read bit line RBL1 524b. 10T SRAM cell array 500b can illustrate reading a data value of '1' (e.g., Q='1' and QB='0') onto RBL1 524b, denoted as 'RBL1' corresponding to the data value. Similar to 10T SRAM cell array 500a, cell 501b can illustrate a selected cell in 10T SRAM cell array 500b with RWL='1' (also referred to as "selected cell 501b") and cell 502b can illustrate other unselected cells coupled to RBL1 524b in 10T SRAM cell array 500b with RWL='0' (also referred to as "unselected cell 502b"). Under certain conditions, selected cell 501b can store a data value of '1' (e.g., Q='1' and QB='0') and the data value in selected cell 501b can be read onto RBL1 524b. Unselected cells illustrated by unselected cell 502b can store data values of '0' (e.g., Q='0' and QB='1') the data values in the unselected cells may not be read onto RBL1 524b.

According to some embodiments, 10T SRAM cell arrays 500a and 500b can have data-independent leakage current (e.g., current leakage does not depend on the stored data values of Q and QB). During an RBL Read '0' operation for 10T SRAM cell array 500a, selected cell 501a can store a data value of '0' (e.g., Q='0' and QB='1'), and unselected cell 502a can store a data value of '1' (e.g., Q='1' and QB='0'). RBL0 524a can be pre-charged to a supply voltage (e.g., a logic value of '1') and can read the data value in selected cell 501a. For selected cell 501a, VGND='0,' transistors 511a, 513a, and 514a are 'ON' and RBL0 is discharged to '0' with a discharging current $I_{cell-RVG-10T}$. For unselected cell 502a, VGND='1,' transistors 515a and 516a are 'OFF' and transistors 517a and 518a are 'ON.' Transistor 515a can charge RBL0 with a leakage current, $I_{leak-RVG-8T}$. Accordingly, for 10T SRAM cell array 500a during the RBL Read '0' operation, a total current discharging RBL0 can be $I_{Cell-RVG-10T} - I_{leak-RVG-10T}$, as shown in a schematic graph 510. As $I_{leak-RVG-10T}$ can still pass through selected cell 501a after discharging of RBL0, a stable voltage of RBL0 can be limited by $I_{leak-RVG-10T}$, as shown by 523 in graph 520.

During an RBL Read '1' operation for 10T SRAM cell array 500b, selected cell 501b can store a data value of '1' (e.g., Q='1' and QB='0'), and unselected cell 502b can store a data value of '0' (e.g., Q='0' and QB='1'). RBL1 524b can be pre-charged to a supply voltage (e.g., a logic value of '1') and can read the data value in selected cell 501b. For selected cell 501b, VGND='0,' transistor 512b is 'ON,' transistors 511b, 513b, and 514b are 'OFF,' and RBL1 can be maintained at the supply voltage such that RBL1 524b can maintain a logic value of '1.' For unselected cell 502b, VGND='1,' transistors 515b and 516b are 'OFF' and transistors 517b and 518b are 'ON.' Terminal 527b can have a logic value of '0' and transistor 515b can have a gate to source voltage of negative supply voltage, thereby significantly reducing leakage current. Accordingly, for 10T SRAM cell array 500b during the RBL Read '1' operation, the leakage current can be zero, as shown in schematic graph 510. In some embodiments, the RBL sensing margin of a 10T SRAM cell array can be determined based upon the current differential of RBL0-RBL1 or $(I_{Cell-RVG-10T} - I_{leak-RVG-10T})$, as shown in schematic graph 510.

In some embodiments, the data-independent current leakage can improve RBL sensing margin. Graph 520 depicts the RBL sensing margin of a 10T SRAM cell array over time. As shown in graph 520, the voltage of RBL0 over time is depicted as a dash line while the voltage over time of RBL1 is depicted as a solid line. The dotted, vertical line represents the time when the RWL is switched from '0' to '1' (i.e., a read operation starts). The voltage differential area 521 between RBL0 and RBL1 can represent the RBL sensing margin for the 10T SRAM cell array, greatly improved from voltage differential area 221 for an 8T SRAM cell array in graph 220.

Figure 6A:
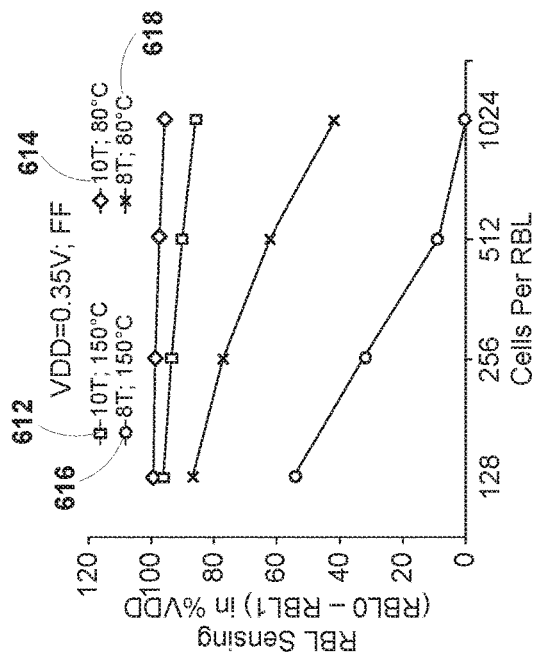
FIGS. 6A-6C illustrate RBL sensing margins of 8T SRAM and 10T SRAM cells under various conditions and with various cells, according to some embodiments of the present disclosure.
Figure 6B:
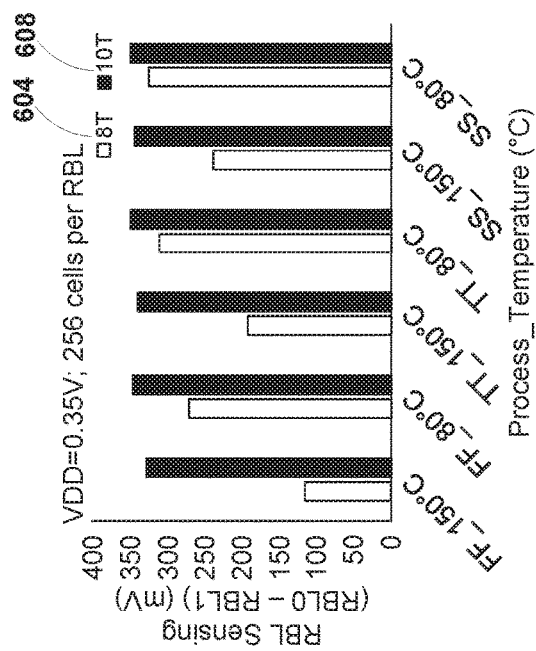
Figure 6C:
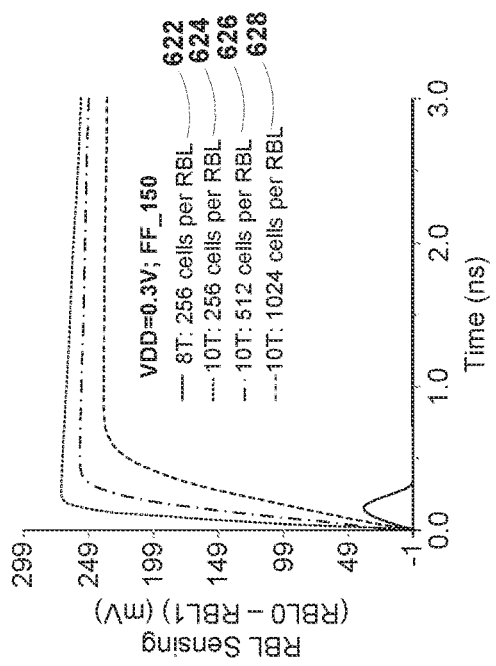

FIGS. 6A-6C illustrate RBL sensing margins of 8T SRAM and 10T SRAM cells under various conditions and with various cells, according to some embodiments of the present disclosure. FIG. 6A is a graph illustrating the RBL sensing margin (RBL0-RBL1) in voltage for 8T SRAM and 10T SRAM cell configurations based at least on different process corners and temperatures, according to some embodiments. In some embodiment, $I_{leak-max-8T}$ for an 8T SRAM cell and $I_{leak-RVG-10T}$ for a 10T SRAM cell can depend on a total number of unselected cells connected to the RBL. A simulation setup with 256 cells per RBL and a supply voltage, VDD, of 0.35V is used to obtain the simulation results shown in the graph of FIG. 6A. Dataset 604 corresponds to the RBL sensing performance of an 8T SRAM cell configuration and dataset 608 corresponds to the RBL sensing performance of a 10T SRAM cell configuration. Three process corners are compared in combination with the 8T and 10T SRAM configurations: FF, Typical NMOS Typical PMOS (TT), and Slow NMOS Slow PMOS (SS). In some embodiments, the 10T SRAM cell array achieves improved RBL sensing margin at certain process corners and temperatures. For example, at a process corner with Fast NMOS Fast PMOS (FF) and a temperature of 150° C., which can be a worst-case scenario for RBL leakage, the RBL sense margin improves about 328 mV for 10T SRAM cell arrays compared to 8T SRAM cell arrays.

FIG. 6B is a graph illustrating the RBL sensing margin (RBL0-RBL1) for 8T SRAM and 10T SRAM cells based at least on the number of cells per RBL at different temperatures, according to some embodiments. The RBL sensing margin can be shown as a percentage of a supply voltage, VDD. A simulation setup with a VDD of 0.35V at FF of worst process corner can be used to obtain the simulation results shown in the graph of FIG. 6B. 10T SRAM cell array can have improved RBL sensing margin over 8T SRAM cell array for different number of cells. For example, for 1024 cells per RBL, the RBL sensing margin of data set 612 for 10T SRAM at 150° C. data has about 86% VDD, improved more than about ten times over the RBL sensing margin of data set 616 for 8T SRAM at 150° C. (less than about 5% VDD). Furthermore, 10T SRAM can support up to 1024 cells per RBL at both 80° C. (e.g., data set 614) and 150° C. (e.g., data set 612) while the 8T SRAM can only supports 1024 cells per RBL at 80° C. (e.g., data set 618).

FIG. 6C is a graph illustrating the RBL sensing margin of 8T and 10T SRAM cells over time, according to some embodiments. RBL sensing time windows can be critical for single-ended sense amplifier sensing. For data set 622 of an 8T SRAM cell array with 256 cells per RBL, the sensing time window is approximately 50 picoseconds (ps) with an RBL sensing voltage of about 37 mV. In some embodiments, 8T SRAM cell array with about 50 ps sensing time window and about 37 mV RBL sensing voltage may not be accessible to read. By contrast, 10T SRAM cell arrays can improve sensing time windows and RBL sensing voltage significantly, as shown in FIG. 6C. For data set 624 of a 10T SRAM cell array with 256 cells per RBL, the sensing time window is about 80% to about 100% of RWL 'ON' window. In addition, data set 624 has a RBL sensing voltage of about 270 mV, about seven times improvement compared to 8T SRAM. Similar improvements are shown through data sets 626 and 628 for 10T SRAM configurations with 512 and 1024 cells per RBL.

Figures 7A, 7B:
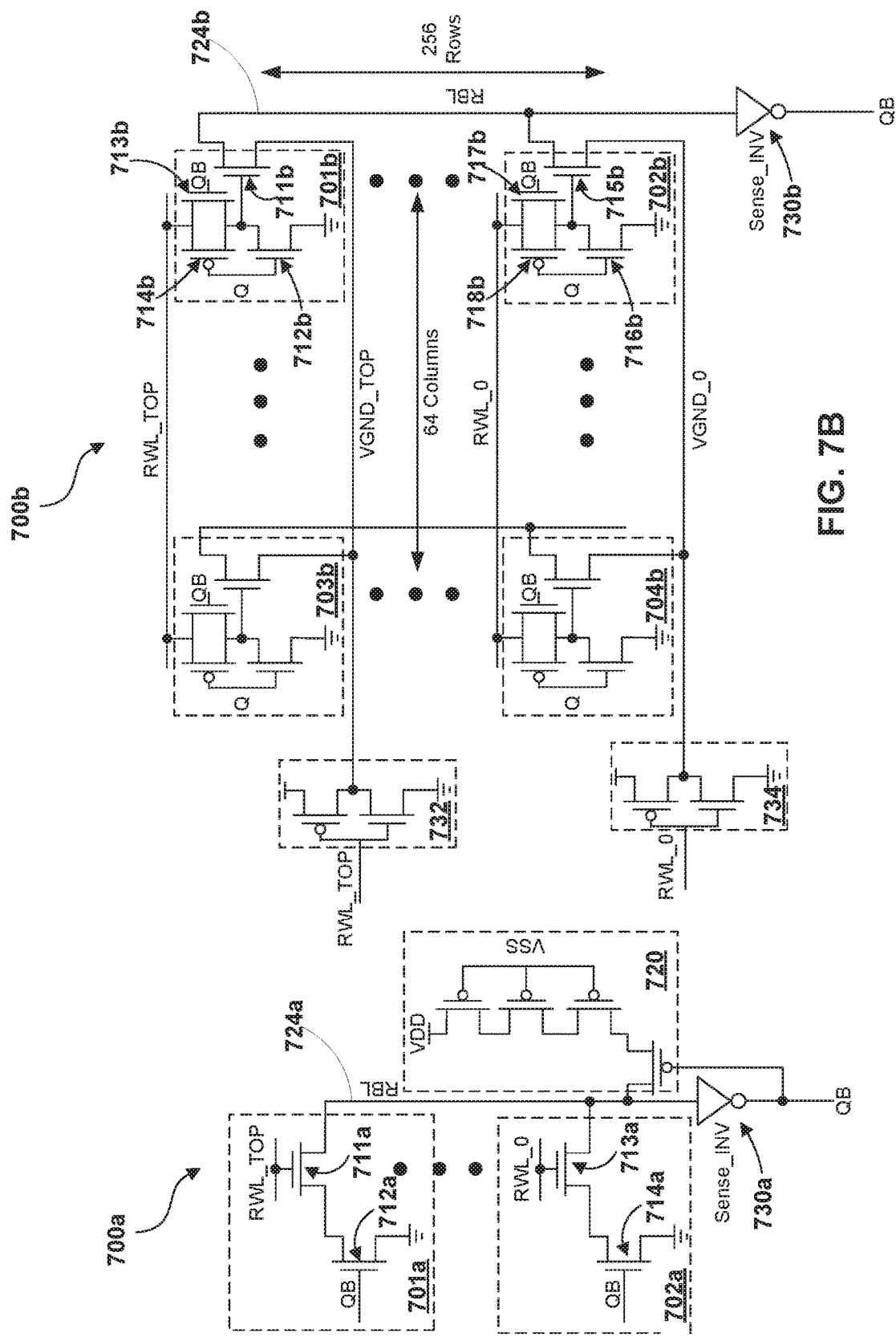
FIGS. 7A-7B depict circuits diagrams illustrating an 8T SRAM cell array with a weak p-type MOS (PMOS) keeper and a 10T SRAM cell array without a keeper, according to some embodiments of the present disclosure.

In some embodiments, RBL single-ended sensing can employ large signal sensing through a sense inverter and a weak transistor keeper (e.g., a weak PMOS keeper). FIGS. 7A and 7B depict circuits diagrams illustrating an 8T SRAM cell array 700a with a weak p-type MOS (PMOS) keeper 720 and a 10T SRAM cell array 700b without a keeper, respectively, according to some embodiments of the present disclosure. A weak PMOS keeper can be used to compensate for current leakage through unselected cells of an SRAM cell array. The write ports of the cells in 8T SRAM cell array 700a and 10T SRAM cell array 700b are not illustrated in FIGS. 7A and 7B merely for clarity and ease of description.

FIG. 7A depicts an 8T SRAM cell array with a weak PMOS keeper, according to some embodiments. Cells of 8T SRAM cell array 700a (e.g., cells 701a and 702a) are coupled to RBL 724a, sense inverter 730a, and weak PMOS keeper 720. Although not depicted, more cells can be coupled (e.g., 256 cells coupled) to RBL 724a. Read ports of cells 701a and 702a are configured similar to 2T read port 104 in FIG. 1. Read port of cell 701a includes transistors 711a and 712a. Read port of cell 702a includes transistors 713a and 714a. RBL 724a couples a column of 8T SRAM cells to the input of sense inverter 730a and a source/drain terminal of a weak PMOS keeper 720. Weak PMOS keeper 720 includes four PMOS transistors. Three of the four PMOS transistors are connected in series (e.g., a source/drain terminal of one PMOS transistor is connected to a source/drain terminal of another PMOS transistor) and driven by a VSS voltage at their gate terminals. A supply voltage VDD is connected to a source/drain terminal and passes through each of the three PMOS transistors when VSS has a logic value of '0'. The fourth PMOS transistor is coupled to sense inverter 730a, RBL 724a, and the three VSS-driven PMOS transistors such that the fourth PMOS transistor can selectively compensate for current leakage when RBL 724a is reading QB='0.' For example, when QB='0,' RBL 724a is reading a logic value '1' and the output of sense inverter is '0.' The leakage current can be compensated by enabling supply voltage VDD connected to RBL 724a through four 'ON' PMOS transistors. In some embodiments, the configuration depicted in FIG. 7A represents a design choice of a trade-off between a larger RBL sensing margin and read '0' time. In some embodiments, simulation results can illustrate that 8T SRAM cell array may not operate below 0.5 V for an RBL read '0' operation.

FIG. 7B depicts a 10T SRAM cell array with 256 rows and 64 columns for large signal sensing without a keeper, according to some embodiments. As shown in FIG. 7B, cells 701b and 702b are coupled to RBL 724b and sense inverter 730b in one column of 10T SRAM cell array 700b. Cells 703b and 704b of 10T SRAM cell array 700b are coupled to another RBL and another sense inverter (not shown) in another column of 10T SRAM cell array 700b. The write ports for cells 704b and other cells of 10T SRAM cell array 700b with 256×64 cells are not illustrated in FIG. 7b merely for clarity and ease of description. Read ports of cells 701b-704b and other cells can be configured similar to 4T read port 304 in FIG. 3. Read port of cell 701b includes transistors 711b-714b. Read port of cell 702b includes transistors 715b-718b. RBL 724b couples a column of 10T SRAM cells to the input of sense inverter 730b, which can be accessible for a memory read operation (e.g., accessible to the data value of QB). VGND of each row in 10T SRAM cell array 700b is coupled to respective RWL through an inverter (e.g., inverter 732 and inverter 734). As a result, when a cell is unselected (i.e., RWL='0'), VGND can have a logic value of '1,' which can set the gate to source voltage of the transistor connected to the RBL (e.g., 711b and 715b) to a negative supply voltage and thereby reduce leakage current. Compared to 8T SRAM cell array 700a, 10T SRAM cell array 700b can significantly improve RBL sensing margin and thereby can perform a read operation without a keeper. Simulations in FIG. 6 can illustrate that 10T SRAM cell array 700b in FIG. 7b can operate below a supply voltage of about 0.5 V due to the improvement of RBL sensing margin.

Figure 8:
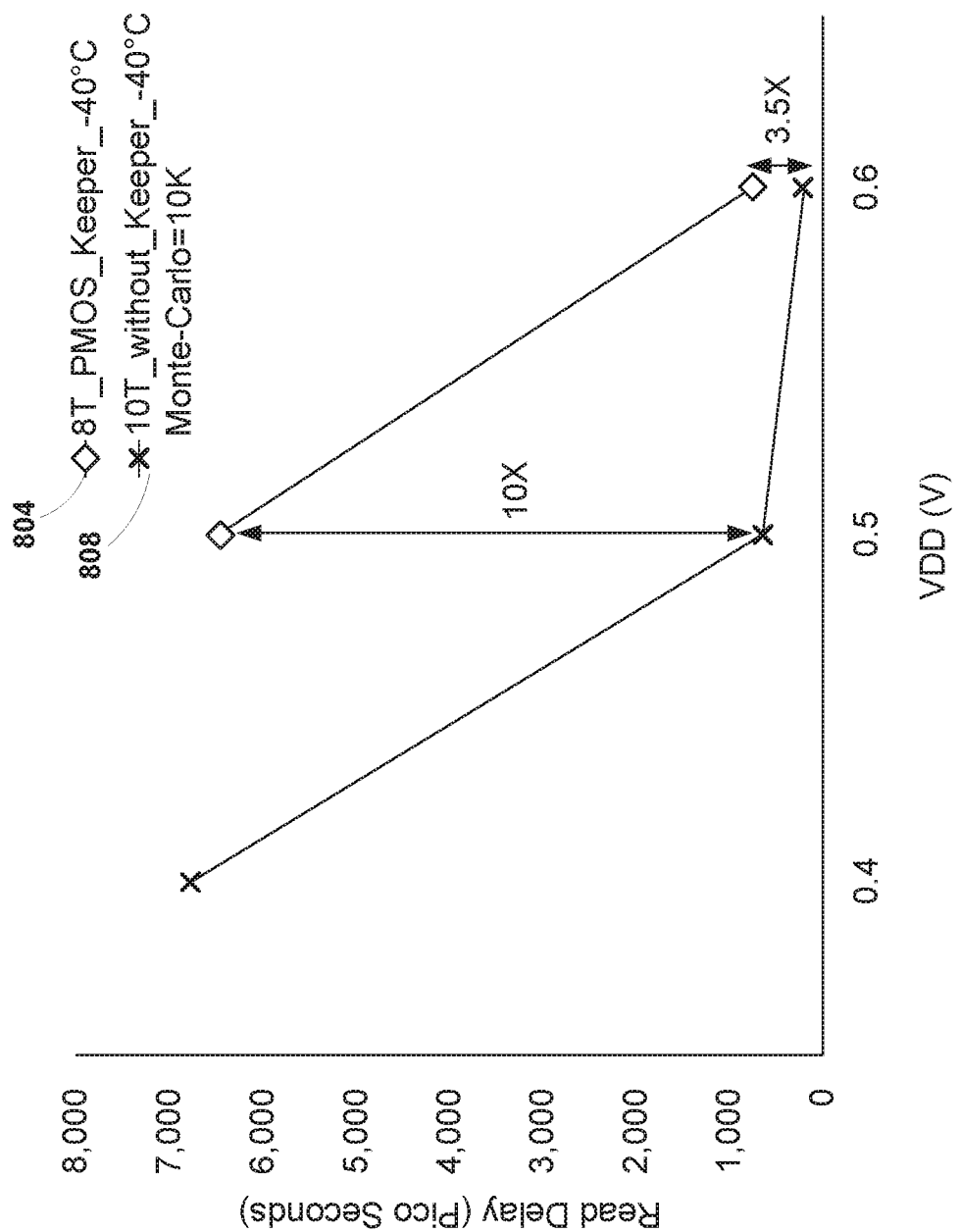
FIG. 8 illustrates simulations of Read '0' delays for an 8T SRAM cell array with a weak PMOS keeper and a 10T SRAM cell array without a keeper under various VDD, according to some embodiments of the present disclosure.

FIG. 8 illustrates simulations of Read '0' time delays for an 8T SRAM cell array with a weak PMOS keeper (e.g., 700a in FIG. 7A) and a 10T SRAM cell array without a keeper (e.g., 700b in FIG. 7B) under various supply voltages (VDD), according to some embodiments of the present disclosure. The simulation results of Read '0' delay at −40° C. are depicted as a function of VDD for an 8T SRAM cell array with a weak PMOS keeper (e.g., 700a in FIG. 7A) in data set 804 and a 10T SRAM cell array without a keeper (e.g., 700b in FIG. 7B) in data set 808. In some embodiments, the Read '0' time delays can be determined with a 10,000 (10K) Monte Carlo sample simulations. In some embodiments, the Read '0' time delays can be quantified from a mean plus six sigma of the Monte Carlo sample simulations. In some embodiments, a Read '0' time delay can be determined based on a time taken from the RWL rising to 50% of a supply voltage to a time taken for QB to rise to 80% of the supply voltage. As shown in FIG. 8, the Read '0' time delay increases as the VDD decreases for the 8T SRAM cell array with a weak PMOS keeper (e.g., 700a in FIG. 7A) and a 10T SRAM cell array without a keeper (e.g., 700b in FIG. 7B). Compared to the 8T SRAM cell array, the 10T SRAM cell array reduces the Read '0' time delay at −40° C. by about 3.5 times at VDD=0.6 V and about 10 times at VDD=0.5 V. Accordingly, a 10T SRAM cell array with VGND can improve Read '0' time delay at −40° C.

Figure 9:
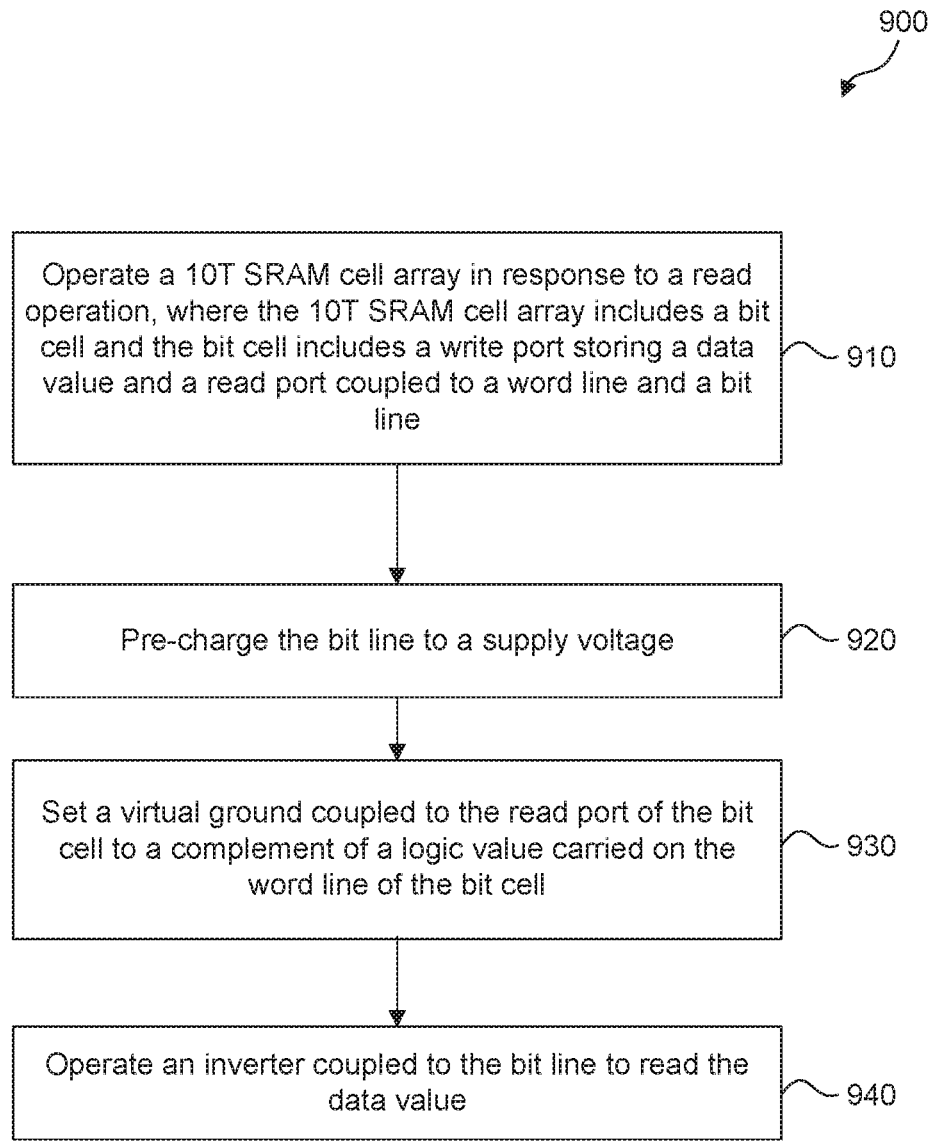
FIG. 9 illustrates a flow-chart of a method to read a data value in a 10T SRAM cell array without a keeper, according to some embodiments of the present disclosure.

FIG. 9 illustrates a flow-chart of method 900 to read a data value in a 10T SRAM cell array without a keeper, according to some embodiments of the present disclosure. Additional operations may be performed between various operations of method 100 and may be omitted merely for clarity and ease of description. Additionally, some of the operations may be performed simultaneously, or in a different order than the ones shown in FIG. 9. Accordingly, it is understood that additional processes can be provided before, during, and/or after method 100, and that these additional processes can be briefly described herein. For illustrative purposes, the operations illustrated in FIG. 9 can be described with reference to the example processes and layouts to read a data value in a 10T SRAM cell array as illustrated in FIGS. 3-7.

Referring to FIG. 9, at 910, a 10T SRAM cell array is operated to in response to a read operation. The 10T SRAM cell array includes a bit cell and the bit cell includes a write port storing a data value and a read port coupled to a read word line and a read bit line. For example, as shown in FIGS. 3 and 7, data values stored in 10T SRAM cell array 700b can be read in response to a read operation. 10T SRAM cell array 700b can include 10T SRAM cells 701b-704b, which can be similar to 10T SRAM cell 300 in FIG. 3. 10T SRAM cell 300 can include 6T write port 302 to storing data values Q and QB and 4T read port 304 coupled to read word line RWL 328 and RBL 324.

Referring to FIG. 9, at 920, the read bit line is pre-charged to a supply voltage. For example, as shown in FIGS. 3, 4(b), 5(b), and 7(b), RBLs 324, 424b, 524b, and 724b can be pre-charged to a supply voltage (e.g., VDD) during a read operation. The charge on the RBL can change based on the data value of the selected cell.

Referring to FIG. 9, at 930, a virtual ground coupled to the read port of the bit cell is set to a complement of a logic value carried on the read word line of the bit cell. For example, as shown in FIGS. 3, 5(b), and 7(b), VGND can be coupled to RWL through an inverter and can be set a logic value complementary to the logic value on RWL. For the unselected cell, RWL='0' and VGND='1,' which can set the gate to source voltage of the transistor connected to the RBL (e.g., 515b in FIG. 5) to a negative supply voltage during a read '1' operation and thereby can reduce leakage current.

Referring to FIG. 9, at 940, an inverter coupled to the read bit line is operated to read the data value. For example, as shown in FIG. 7(b), inverter 730b is coupled to RBL 724b and can be accessible for a memory read operation to read the data value stored in the write port of cell 702b (e.g., QB).

Figure 10:
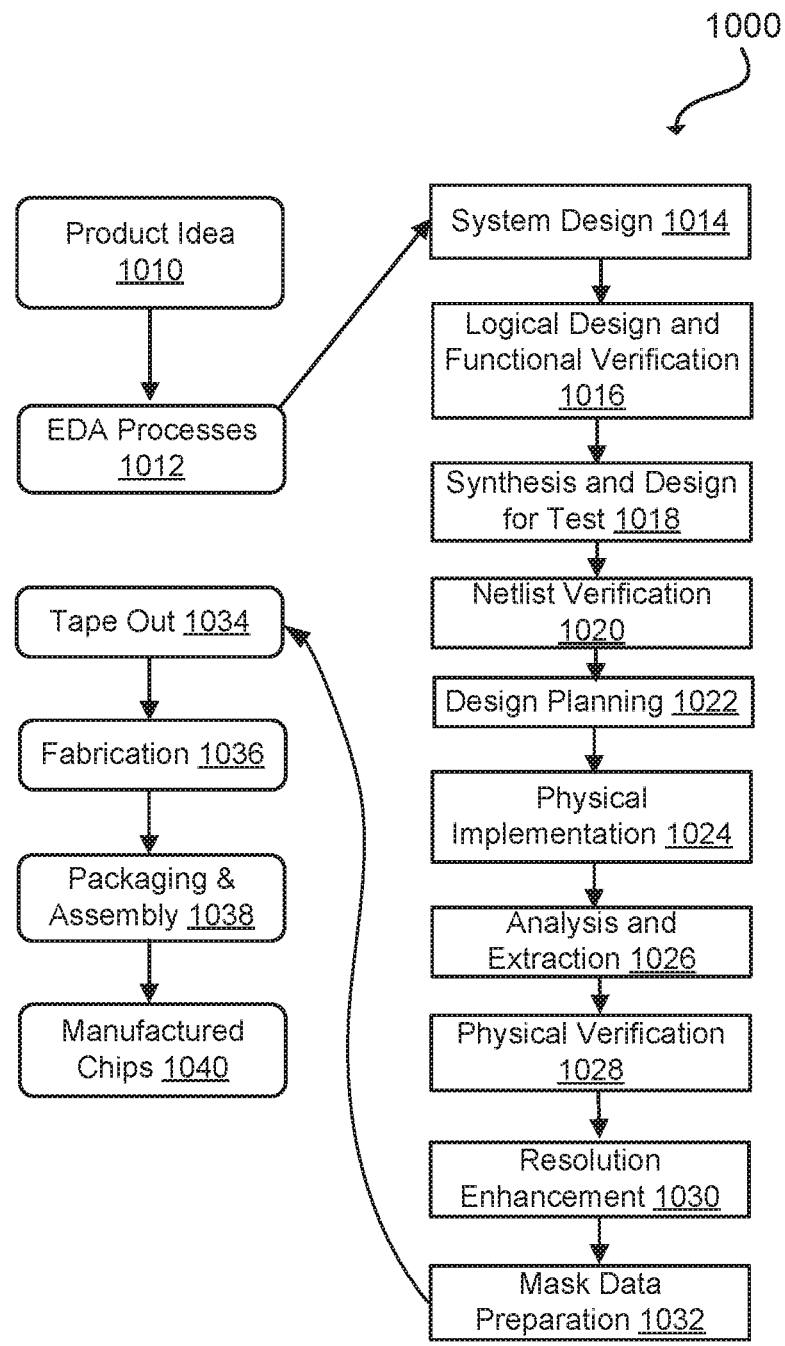
FIG. 10 depicts a flowchart of various processes used during the design and manufacture of an integrated circuit in accordance with some embodiments of the present disclosure.

FIG. 10 illustrates an example set of processes 1000 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1010 with information supplied by a designer, information which is transformed to create an article of manufacture that uses a set of EDA processes 1012. When the design is finalized, the design is taped-out 1034, which is when artwork (e.g., geometric patterns) for the integrated circuit is sent to a fabrication facility to manufacture the mask set, which is then used to manufacture the integrated circuit. After tape-out, a semiconductor die is fabricated 1036 and packaging and assembly processes 1038 are performed to produce the finished integrated circuit 1040.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 10. The processes described by be enabled by EDA products (or tools).

During system design 1014, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1016, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1018, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1020, the netlist is checked for compliance with timing constraints and for correspondence with the HDL code. During design planning 1022, an overall floor plan for the integrated circuit is constructed and analyzed for timing and top-level routing.

During layout or physical implementation 1024, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1026, the circuit function is verified at the layout level, which permits refinement of the layout design. During physical verification 1028, the layout design is checked to ensure that manufacturing constraints are correct, such as DRC constraints, electrical constraints, lithographic constraints, and that circuitry function matches the HDL design specification. During resolution enhancement 1030, the geometry of the layout is transformed to improve how the circuit design is manufactured.

During tape-out, data is created to be used (after lithographic enhancements are applied if appropriate) for production of lithography masks. During mask data preparation 1032, the 'tape-out' data is used to produce lithography masks that are used to produce finished integrated circuits.

A storage subsystem of a computer system (such as computer system 1100 of FIG. 9, or host system 807 of FIG. 8) may be used to store the programs and data structures that are used by some or all of the EDA products described herein, and products used for development of cells for the library and for physical and logical design that use the library.

Figure 11:
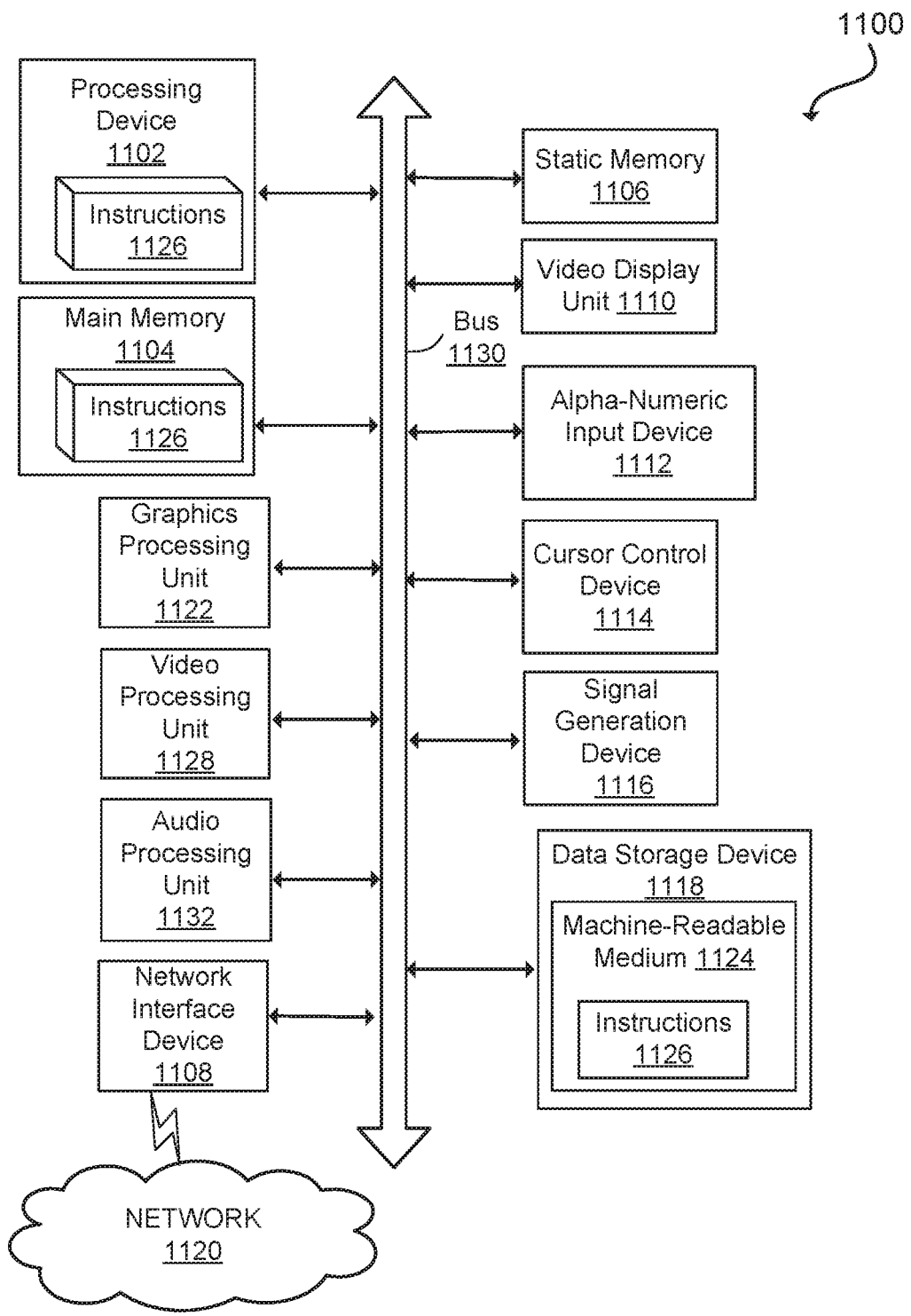
FIG. 11 depicts an abstract diagram of an example computer system in which embodiments of the present disclosure may operate.

FIG. 11 illustrates an example machine of a computer system 1100 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM), a static memory 1106 (e.g., flash memory, static random access memory (SRAM), etc.), and a data storage device 1118, which communicate with each other via a bus 1130.

Processing device 1102 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1102 may also be one or more special-purpose processing devices such as an application specific integrated circuit (ASIC), a field programmable gate array (FPGA), a digital signal processor (DSP), network processor, or the like. The processing device 1102 may be configured to execute instructions 1126 for performing the operations and steps described herein.

The computer system 1100 may further include a network interface device 1108 to communicate over the network 1120. The computer system 1100 also may include a video display unit 1110 (e.g., a liquid crystal display (LCD) or a cathode ray tube (CRT)), an alphanumeric input device 1112 (e.g., a keyboard), a cursor control device 1114 (e.g., a mouse), a graphics processing unit 1122, a signal generation device 1116 (e.g., a speaker), graphics processing unit 1122, video processing unit 1128, and audio processing unit 1132.

The data storage device 1118 may include a machine-readable storage medium 1124 (also known as a non-transitory computer-readable medium) on which is stored one or more sets of instructions 1126 or software embodying any one or more of the methodologies or functions described herein. The instructions 1126 may also reside, completely or at least partially, within the main memory 1104 and/or within the processing device 1102 during execution thereof by the computer system 1100, the main memory 1104 and the processing device 1102 also constituting machine-readable storage media.

In some implementations, the instructions 1126 include instructions to implement functionality corresponding to the present disclosure. While the machine-readable storage medium 1124 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1102 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A memory cell array, comprising:
   a write port and a read port being connected through a first data storage line and a second data storage line; and
   a plurality of word lines and bit lines arranged in rows and columns such that the read port is coupled to a virtual ground, a read word line of the plurality of word lines, and a read bit line of the plurality of bit lines, wherein a first value of the virtual ground is set by a second value on the read word line and wherein the read port comprises:

a first transistor coupled to at least the read bit line and the virtual ground, a second transistor coupled to at least the first data storage line and the first transistor, a third transistor coupled to at least the second data storage line, the read word line, the first transistor, and the second transistor, and a fourth transistor coupled to at least the first data storage line, the read word line, the first transistor, the second transistor, and the third transistor.

2. The memory cell array of claim 1, wherein the write port is configured to store a data value, the first data storage line is configured to carry the data value to the read port, and the second data storage line is configured to carry a complement of the data value to the read port.

3. The memory cell array of claim 1, where in the virtual ground is operatively connected to the read word line through an inverter.

4. The memory cell array of claim 1, wherein the first data storage line is connected to a gate terminal of the second transistor and a gate terminal of the fourth transistor.

5. The memory cell array of claim 1, wherein the second data storage line is connected to a gate terminal of the third transistor.

6. The memory cell array of claim 1, wherein the read bit line is further coupled to an inverter and the output of the inverter is accessible for a memory read operation.

7. The memory cell array of claim 1, wherein the read word line is connected to a shared source/drain terminal of the third and the fourth transistors.

8. The memory cell array of claim 1, wherein a gate terminal of the first transistor is connected to a shared source/drain terminal of the second, third, and fourth transistors.

9. The memory cell array of claim 1, wherein the first transistor is connected to the read bit line through a source/drain terminal and connected to the virtual ground through another source/drain terminal.

10. A memory device, comprising:
a memory cell array comprising first bit cell and second bit cell, wherein each of the first bit cell and the second bit cell comprises a write port and a read port being connected through a first data storage line and a second data storage line; and a plurality of word lines and bit lines arranged in rows and columns and being connected to the first bit cell and the second bit cell, wherein the read ports of the first and second bit cells are connected to a common read bit line of the plurality of bit lines, wherein the read port of the first bit cell is coupled to a first virtual ground, a first read word line of the plurality of word lines, the first virtual ground being connected to the first read word line through a first inverter, and wherein the read port of the second bit cell is coupled to a second virtual ground and a second read word line of the plurality of word lines, the second virtual ground being connected to the second read word line through a second inverter.

11. The memory device of claim 10, wherein:
the write port of the first bit cell is configured to store a data value, the first data storage line is configured to carry the data value to the read port of the first bit cell, and the second data storage line is configured to carry a complement of the data value to the read port of the first bit cell.

12. The memory device of claim 10, wherein the first data storage line is connected to a gate terminal of a first transistor and a gate terminal of a second transistor in the read port of the first bit cell.

13. The memory device of claim 12, wherein the second data storage line is connected to a gate terminal of a third transistor in the read port of the first bit cell.

14. The memory device of claim 10, wherein the read word line is connected to a shared source/drain terminal of first and second transistors in the read port of the first bit cell.

15. The memory device of claim 10, wherein the read port of the first bit cell is connected to the read bit line through a source/drain terminal of a first transistor in the read port of the first bit cell and connected to the virtual ground through another source/drain terminal of the first transistor in the read port of the first bit cell.

16. The memory device of claim 15, wherein a gate terminal of the first transistor in the read port of the first bit cell is connected to a shared source/drain terminal of second, third, and fourth transistors in the read port of the first bit cell.

17. The memory device of claim 10, wherein the read bit line is further coupled to an inverter and the output of the inverter is accessible for a memory read operation.

18. A method, comprising:
operating a memory cell array in response to a read operation, wherein the memory cell array comprises a write port storing a data value and a read port coupled to a read word line and a read bit line;

pre-charging the read bit line to a supply voltage;

setting the read word line to a value in response to the read operation;

setting a virtual ground to a complement value of the value carried on the read word line, wherein the virtual ground is coupled to the read port; and operating an inverter coupled to the read bit line to read the data value.

19. The method of claim 18, wherein operating the memory cell array comprises passing the data value in the write port to the read port through a data storage line and a complementary data storage line.

20. The method of claim 18, wherein setting the virtual ground comprises: setting the virtual ground to a logic value of '0' in response to a selection of a bit cell of the memory cell array.

* * * * *

UNITED STATES PATENT AND TRADEMARK OFFICE
CERTIFICATE OF CORRECTION

| | |
|---|---|
| PATENT NO. | : 11,532,352 B2 |
| APPLICATION NO. | : 17/025448 |
| DATED | : December 20, 2022 |
| INVENTOR(S) | : M. Sultan M. Siddiqui et al. |

It is certified that error appears in the above-identified patent and that said Letters Patent is hereby corrected as shown below:

On the Title Page

Item (57) Abstract, Line 12    After "coupled" insert --to--

In the Claims

Column 17, Claim 3, Line 17    Delete "where in" and insert --wherein--

Signed and Sealed this
Sixteenth Day of May, 2023

Katherine Kelly Vidal
*Director of the United States Patent and Trademark Office*